(12) United States Patent
Shen et al.

(10) Patent No.: US 9,787,339 B2
(45) Date of Patent: Oct. 10, 2017

(54) RECEIVER SIGNAL STRENGTH INDICATOR METER FOR AUTOMATIC ANTENNA ALIGNMENT IN INDOOR AND OUTDOOR MOUNT APPLICATIONS

(71) Applicant: ZTE (USA) INC., Richardson, TX (US)

(72) Inventors: Ying Shen, Chapel Hill, NC (US); Aleksandr Semenyshev, Apex, NC (US); Ed Nealis, Cary, NC (US); Shawn Walsh, Cary, NC (US)

(73) Assignee: ZTE (USA) INC., Richardson, TX (US)

( * ) Notice: Subject to any disclaimer, the term of this patent is extended or adjusted under 35 U.S.C. 154(b) by 530 days.

(21) Appl. No.: 14/382,098

(22) PCT Filed: Feb. 27, 2013

(86) PCT No.: PCT/US2013/028045
§ 371 (c)(1),
(2) Date: Aug. 29, 2014

(87) PCT Pub. No.: WO2013/138067
PCT Pub. Date: Sep. 19, 2013

(65) Prior Publication Data
US 2015/0015435 A1    Jan. 15, 2015

Related U.S. Application Data

(60) Provisional application No. 61/610,960, filed on Mar. 14, 2012, provisional application No. 61/610,962, filed on Mar. 14, 2012.

(51) Int. Cl.
*G01S 3/02* (2006.01)
*H04B 1/16* (2006.01)
(Continued)

(52) U.S. Cl.
CPC ............. *H04B 1/16* (2013.01); *H01Q 1/1257* (2013.01); *H04B 17/23* (2015.01); *H04B 17/309* (2015.01);
(Continued)

(58) Field of Classification Search
CPC ......... G01S 3/02; G01R 29/0871; H04B 1/16; H04B 17/23; H04B 17/309; H04B 17/318; H01Q 1/1257
(Continued)

(56) References Cited

U.S. PATENT DOCUMENTS 4,907,003 A * 3/1990 Marshall ............ H04B 7/18517
342/352
5,351,060 A    9/1994 Bayne
(Continued)

FOREIGN PATENT DOCUMENTS

CN    1777073 A    5/2006
CN    101478336 A    7/2009
(Continued)

OTHER PUBLICATIONS

ZTE (USA) Inc., International Search Report and Written Opinion, PCT/US2013/028045, May 29, 2013, 7 pgs.
(Continued)

*Primary Examiner* — Harry Liu
(74) *Attorney, Agent, or Firm* — Morgan, Lewis & Bockius LLP

(57) ABSTRACT

An antenna RSSI meter includes a microcontroller unit for digitizing an antenna receiver voltage signal, converting the digitized antenna receiver voltage signal into a receiver signal level in accordance with a predefined antenna specification, and converting the receiver signal level into the antenna tuning signal in accordance with the predefined antenna specification. The antenna RSSI meter includes an
(Continued)

input communication port for receiving the antenna receiver voltage signal from an antenna and providing the antenna receiver voltage signal to the microcontroller unit, The antenna RSSI meter also includes an output communication port for receiving the antenna tuning signal from the microcontroller unit and providing the antenna tuning signal to an antenna auto-aligning mechanism for adjusting position and orientation of the antenna.

18 Claims, 7 Drawing Sheets

(51) Int. Cl.

| | | |
|---|---|---|
| H01Q 1/12 | (2006.01) | |
| H04B 17/23 | (2015.01) | |
| H04B 17/309 | (2015.01) | |
| H04B 17/318 | (2015.01) | |
| G01R 29/08 | (2006.01) | |

(52) U.S. Cl.
CPC ....... H04B 17/318 (2015.01); *G01R 29/0871* (2013.01)

(58) Field of Classification Search
USPC .......................................... 342/351
See application file for complete search history.

(56) References Cited

U.S. PATENT DOCUMENTS

| | | | | |
|---|---|---|---|---|
| 5,365,235 A * | 11/1994 | Kennedy | ............... | G01S 13/758 340/10.34 |
| 5,797,083 A | 8/1998 | Anderson | | |
| 5,854,609 A * | 12/1998 | Pyo | .................. | G01S 3/325 342/359 |
| 5,991,609 A * | 11/1999 | Marrah | ................... | H04B 1/18 455/182.2 |
| 6,278,405 B1 | 8/2001 | Ha et al. | | |
| 6,334,218 B1 * | 12/2001 | Jeong | ..................... | H01Q 1/125 342/359 |
| 7,630,695 B2 | 12/2009 | Uribe et al. | | |
| 8,436,681 B2 * | 5/2013 | Ho | ....................... | H02M 3/156 323/283 |
| 2006/0033843 A1 * | 2/2006 | Klopfenstein | ........... | H04N 5/50 348/570 |
| 2007/0216590 A1 * | 9/2007 | Montgomery | ........ | H01Q 1/2258 343/745 |
| 2007/0224948 A1 * | 9/2007 | Hartenstein | .............. | H01Q 9/14 455/101 |
| 2008/0036656 A1 * | 2/2008 | Liao | .......................... | H01Q 1/27 342/359 |
| 2010/0167675 A1 | 7/2010 | Zhao | | |
| 2013/0097880 A1 * | 4/2013 | Wernig | .................... | G01S 17/88 33/228 |
| 2013/0196593 A1 * | 8/2013 | Roper | ..................... | H04B 13/02 455/40 |

FOREIGN PATENT DOCUMENTS

| | | | | |
|---|---|---|---|---|
| CN | 101494318 A | | 7/2009 | |
| CN | 101562877 A | | 10/2009 | |
| CN | 201414133 Y | | 2/2010 | |
| CN | 101916918 A | | 12/2010 | |
| CN | 102064386 A | | 5/2011 | |
| CN | 102324948 A | | 1/2012 | |
| EP | 0507440 A1 | | 10/1992 | |
| EP | 1619812 A1 | | 1/2006 | |
| JP | 05152983 A | * | 6/1993 | |
| JP | WO 2009096303 A1 | * | 8/2009 | ............... H01Q 3/24 |
| KR | 20050115606 A | | 12/2005 | |
| TW | 200541233 A | | 10/2005 | |

OTHER PUBLICATIONS

ZTE (USA) Inc., International Preliminary Report on Patentability, PCT/US2013/028045, Sep. 16, 2014, 5 pgs.
Communication Under Rule 161/162, EP13760713.1 , Nov. 13, 2014, 3 pgs.
ZTE (USA) Inc., Communication Under Rules 70(2) and 70a(2) EPC, EP13760713.1, Oct. 23, 2015, 1 pg.
ZTE (USA) Inc., Extended European Search Report , EP13760713.1, Oct. 6, 2015, 7 pgs.
Office Action, CN201380013949.9, Nov. 30, 2015, 7 pgs.

* cited by examiner

RECEIVER SIGNAL STRENGTH INDICATOR METER FOR AUTOMATIC ANTENNA ALIGNMENT IN INDOOR AND OUTDOOR MOUNT APPLICATIONS

CROSS REFERENCE TO RELATED APPLICATIONS

This application is a United States National Stage Application filed under 35 U.S.C. §371 of PCT Patent Application Serial No. PCT/US2013/028045 filed on Feb. 27, 2013, which claims the benefit of and priority to U.S. Provisional Patent Application No. 61/610,960 filed on Mar. 14, 2012, and U.S. Provisional Patent Application No. 61/610,962 filed on Mar. 14, 2012, which are hereby incorporated by reference in their entireties.

TECHNICAL FIELD

The present invention relates to the equipment used for microwave radio communication, and in particular, to a receiver signal strength indicator meter for automatic antenna alignment in indoor and outdoor mount applications.

BACKGROUND

Microwave communication systems typically consist of many outdoor radio units. An outdoor radio unit (ODU) is coupled to an antenna and it has a receiver signal strength indication (RSSI) port for exporting a voltage signal indicative of a receiver input level at the antenna. Conventionally, a radio installation technician practices a procedure that includes at least the following three steps when installing an antenna and an ODU for the purpose of the line of sight (LOS) alignment. First, the technician uses a digital voltage meter (DVM) to measure the voltage signal at the RSSI port. Next, the technician looks up an RSSI versus receiver signal level (RSL) curve provided by the ODU vendor and converts the voltage signal into a corresponding receiver signal level. Finally, the technician adjusts the position and orientation of the antenna to optimize the antenna's LOS alignment. Since different ODU vendors have different RSL curves for different models, this procedure increases the chance of mis-alignment and wrong alignment because the technician may refer to a wrong curve when installing a particular ODU system. Moreover, the traditional radio alignment method of having a technician work at the top of a cellular tower is labor intensive, dangerous, and time consuming.

SUMMARY

One objective of the present invention is to provide an antenna receiver signal strength indicator meter that automatically converts the antenna receiver voltage signal into a receiver signal level in accordance with a predefined antenna specification. The antenna RSSI meter includes a microcontroller unit that further includes an analog-to-digital converter for digitizing an antenna receiver voltage signal, a module for converting the digitized antenna receiver voltage signal into a receiver signal level in accordance with a predefined antenna specification, and a pulse-width modulator for converting the receiver signal level into the antenna tuning signal in accordance with the predefined antenna specification. The antenna RSSI meter includes an input communication port that is coupled to the microcontroller unit and configured to receive the antenna receiver voltage signal from an antenna and provide the antenna receiver voltage signal to the microcontroller unit through the analog-to-digital converter. The antenna RSSI meter also includes an output communication port that is coupled to the microcontroller unit and configured to receive the antenna tuning signal from the microcontroller unit through the pulse-width modulator and provide the antenna tuning signal to an antenna auto-aligning mechanism for adjusting position and orientation of the antenna.

According to some implementations, the antenna receiver signal strength indicator meter further comprises: a speaker module for broadcasting a sound signal whose frequency substantially corresponds to the receiver signal level; a keypad module for a user to enter operation instructions to the microcontroller unit; a battery module for powering the microcontroller; an inverter and scaler module that is coupled to the input communication port for processing the antenna receiver voltage signal before it reaches the analog-to-digital converter; and a LCD module for displaying the receiver signal level. The LCD module further comprises: a LCD controller, a LCD panel coupled to the LCD controller, and a LED module for providing backlight to the LCD panel Another objective of the present invention is to provide an antenna mount system. The system includes: a receiver signal strength indicator meter that is configured to receive an antenna receiver voltage signal from an antenna and convert the antenna receiver voltage signal into an antenna tuning signal in accordance with a predefined antenna specification, and an antenna auto-aligning mechanism that is coupled to the receiver signal strength indicator meter. The antenna auto-aligning mechanism is configured to receive the antenna tuning signal and adjust position and orientation of the antenna in accordance with the antenna tuning signal.

Yet another objective of the present invention is to provide a distributed antenna receiver signal strength indicator system. The distributed antenna receiver signal strength indicator system comprises: an antenna receiver signal strength indicator reader for receiving an antenna receiver voltage signal from an antenna and digitizing the antenna receiver voltage signal; and an antenna receiver signal strength indicator meter for receiving the digitized antenna receiver voltage signal from the antenna receiver signal strength indicator reader and converting the antenna receiver voltage signal into an antenna tuning signal in accordance with a predefined antenna specification. The antenna tuning signal is provided to an antenna auto-alignment mechanism for adjusting position and orientation of the antenna for the purpose of the light of sight (LOS) alignment.

According to some implementations, the antenna receiver signal strength indicator reader further includes a microcontroller unit including an analog-to-digital converter for digitizing the antenna receiver voltage signal and an input communication port that is coupled to the microcontroller unit. The input communication port is configured to receive the antenna receiver voltage signal from the antenna and provide the antenna receiver voltage signal to the microcontroller through the analog-to-digital converter.

According to some implementations, the antenna receiver signal strength indicator meter further includes a microcontroller unit including a module for converting the digitized antenna receiver voltage signal into a receiver signal level in accordance with the predefined antenna specification, a pulse-width modulator for converting the receiver signal level into the antenna tuning signal, a digital-to-analog converter for feeding an analog signal to a tone generator for use with a speaker, and an output communication port that is coupled to the microcontroller unit. The output communication port is configured to receive the antenna tuning signal from the microcontroller unit through the pulse-width modulator and provide the antenna tuning signal to the antenna auto-alignment mechanism for adjusting the position and orientation of the antenna.

According to some implementations, there is a wireless connection coupling the antenna receiver signal strength indicator reader to the antenna receiver signal strength indicator meter and the digitized antenna receiver voltage signal is transmitted to the antenna receiver signal strength indicator meter via the wireless connection, which is implemented in accordance with a wireless protocol selected from the group consisting of Wi-Fi, Bluetooth, and RFID. The antenna receiver signal strength indicator reader includes a radio-frequency transceiver module for transmitting the digitized antenna receiver voltage signal to the antenna receiver signal strength indicator meter and the antenna receiver signal strength indicator meter includes a radio-frequency transceiver module for receiving the digitized antenna receiver voltage signal from the antenna receiver signal strength indicator reader.

According to some implementations, there is a wired connection coupling the antenna receiver signal strength indicator reader to the antenna receiver signal strength indicator meter and the digitized antenna receiver voltage signal is transmitted to the antenna receiver signal strength indicator meter via the wired connection. The wired connection is implemented through a cable connecting a pair of serial ports located at the antenna receiver signal strength indicator reader and the antenna receiver signal strength indicator meter, respectively. According to some implementations, the antenna receiver voltage signal is, at least in part, dependent upon the position and orientation of the antenna.

According to some implementations, the antenna receiver signal strength indicator meter further comprises: a speaker module for broadcasting a sound signal whose frequency substantially corresponds to the antenna receiver voltage signal; a keypad module for a user to enter operation instructions to the microcontroller unit; a battery module for powering the microcontroller; a converter and scaler module that is coupled to the input communication port and the analog-to-digital converter for processing the antenna receiver voltage signal before it reaches the analog-to-digital converter; and a LCD module for displaying the receiver signal level. The LCD module further comprises: a LCD controller, a LCD panel coupled to the LCD controller, and a LED module for providing backlight to the LCD panel.

BRIEF DESCRIPTION OF THE DRAWINGS

Different aspects of the present invention as well as features and advantages thereof will be more clearly understood hereinafter as a result of a detailed description of implementations of the present invention when taken in conjunction with the accompanying drawings, which are not necessarily drawn to scale. Like reference numerals refer to corresponding parts throughout the several views of the drawings.

DESCRIPTION OF IMPLEMENTATIONS

Reference will now be made in detail to implementations, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on many types of outdoor radios systems.

Figure 1:
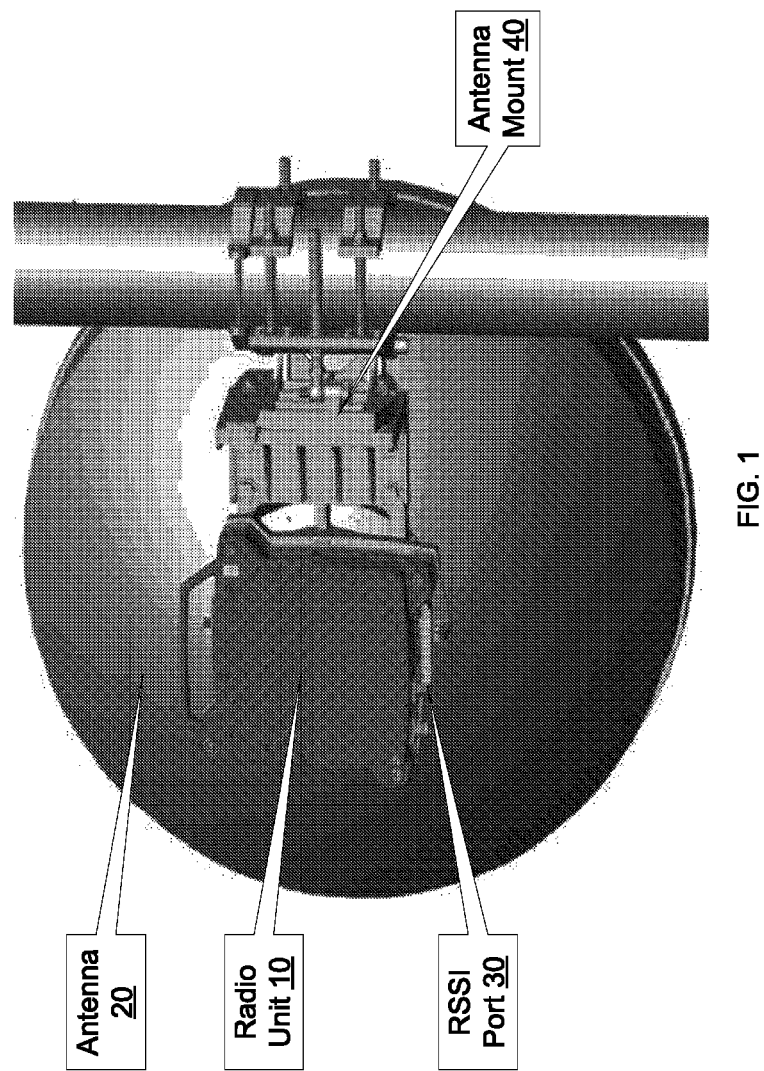
FIG. 1 depicts an outdoor communication application including an antenna and a radio unit that has an RSSI port according to some implementations.

FIG. 1 depicts an outdoor communication application including an antenna. 20 and a radio unit 10 that has an RSSI port 30 according to some implementations. The antenna 20 and the radio unit 10 are attached to a pole through an antenna mount 40. The radio unit 10 and the antenna 20 is coupled to each other so that a wireless signal from a corresponding radio unit and antenna in the line of sight can be detected by the antenna 20 and then transmitted through the radio unit 10 to a destination in the communication network and vice versa. The RSSI port 30 can export a voltage signal indicative of a receiver input level at the antenna 20. A radio installation technician uses this voltage signal as a reference to check whether the position and orientation (e.g., horizontal positions and azimuth) of the antenna is optimized for transmitting/receiving wireless signals to the corresponding antenna in the line of sight.

Figure 2:
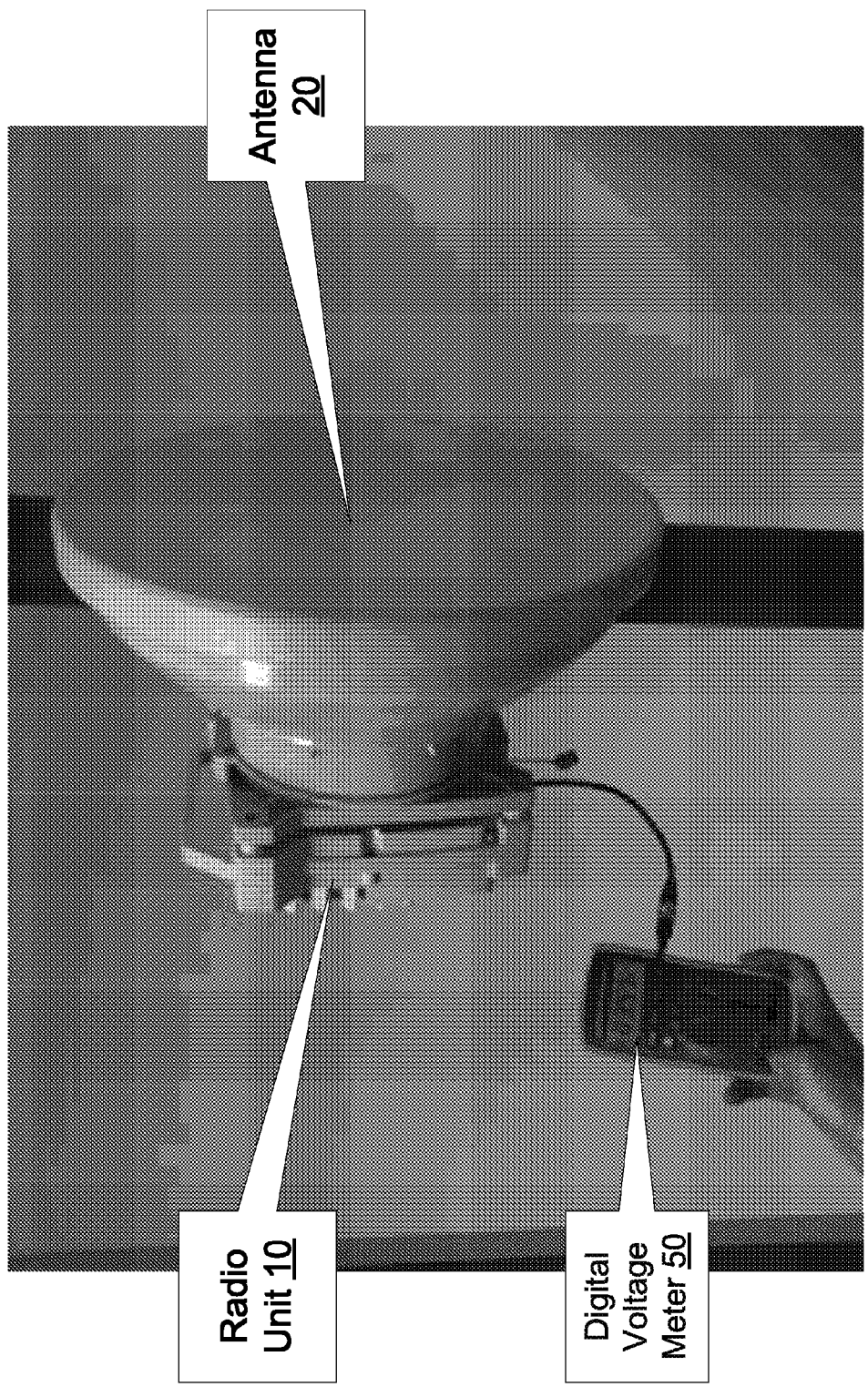
FIG. 2 depicts a process of directly measuring the antenna receiver voltage signal at the RSSI port according to some implementations.

FIG. 2 depicts a process of directly measuring the voltage signal at the RSSI port according to some implementations. In this example, a technician couples the RSSI port of the radio unit 10 to a digital voltage meter (DVM) 50, which displays the magnitude of the voltage signal at the RSSI port. Based on the reading of the DVM 50, the technician can check an installation manual provided by a vendor that manufactures the antenna 20 and the radio unit 10. In particular, the installation manual typically includes an RSSI versus RSL curve that maps a particular voltage level to a corresponding receiver signal level. For example, the curve is a logarithmic curve with the unit of the voltage signal being volt or micro-volt and the unit of the receiver signal level being dBm. From looking up the RSSI versus RSL curve, the technician determines whether the RSL corresponding to the current antenna alignment reaches a pre-defined level (e.g., a minimum value). If not, the technician then manually adjusts the antenna's position and/or orientation to improve the reading on the DVM 50. Note that the technician may repeat this process multiple times until the antenna's alignment meets the predefined specification including the predefined RSL level.

Figure 3:
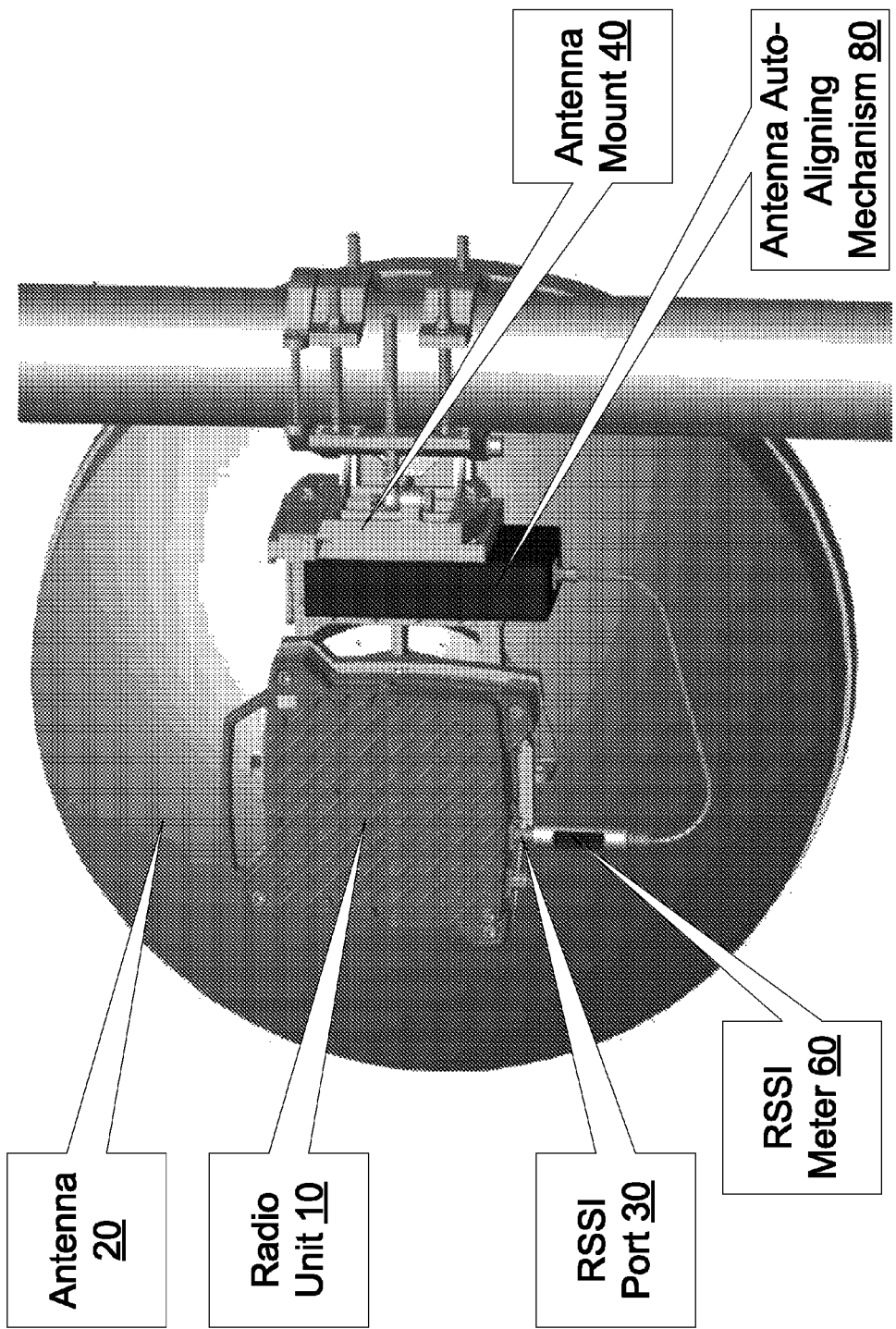
FIG. 3 depicts an outdoor communication application including an antenna, a radio unit that has an RSSI port, and an antenna mount system including an RSSI meter and an antenna auto-aligning mechanism according to some implementations.

FIG. 3 depicts an outdoor communication application including an antenna 20, a radio unit 10 that has an RSSI port 30, and an antenna mount system 40 including an RSSI meter 60 and an antenna auto-aligning mechanism 80 according to some implementations. In this example, the RSSI port 30 feeds the voltage signal into the RSSI meter 60, which then automatically converts the voltage signal into a corresponding antenna tuning signal and exports the antenna tuning signal to the antenna auto-aligning mechanism 80. In response to the antenna tuning signal, the antenna auto-aligning mechanism 80 causes certain parts of the antenna mount 40 to move by an amount defined by the antenna tuning signal. As a result, the antenna 20 has a new position and orientation and generates an updated output at the RSSI port 30. In other words, the RSSI port 30 and the RSSI meter 60 provide a feedback signal to the antenna auto-aligning mechanism 80 for adjusting the position and orientation of the antenna and improving the performance of the antenna 20. As will be described in detail below in connection with FIG. 4, this method can effectively free the technician from the tedious work described above in connection with FIG. 2 and it is also helpful to improve the performance of the entire communication network.

Figure 4:
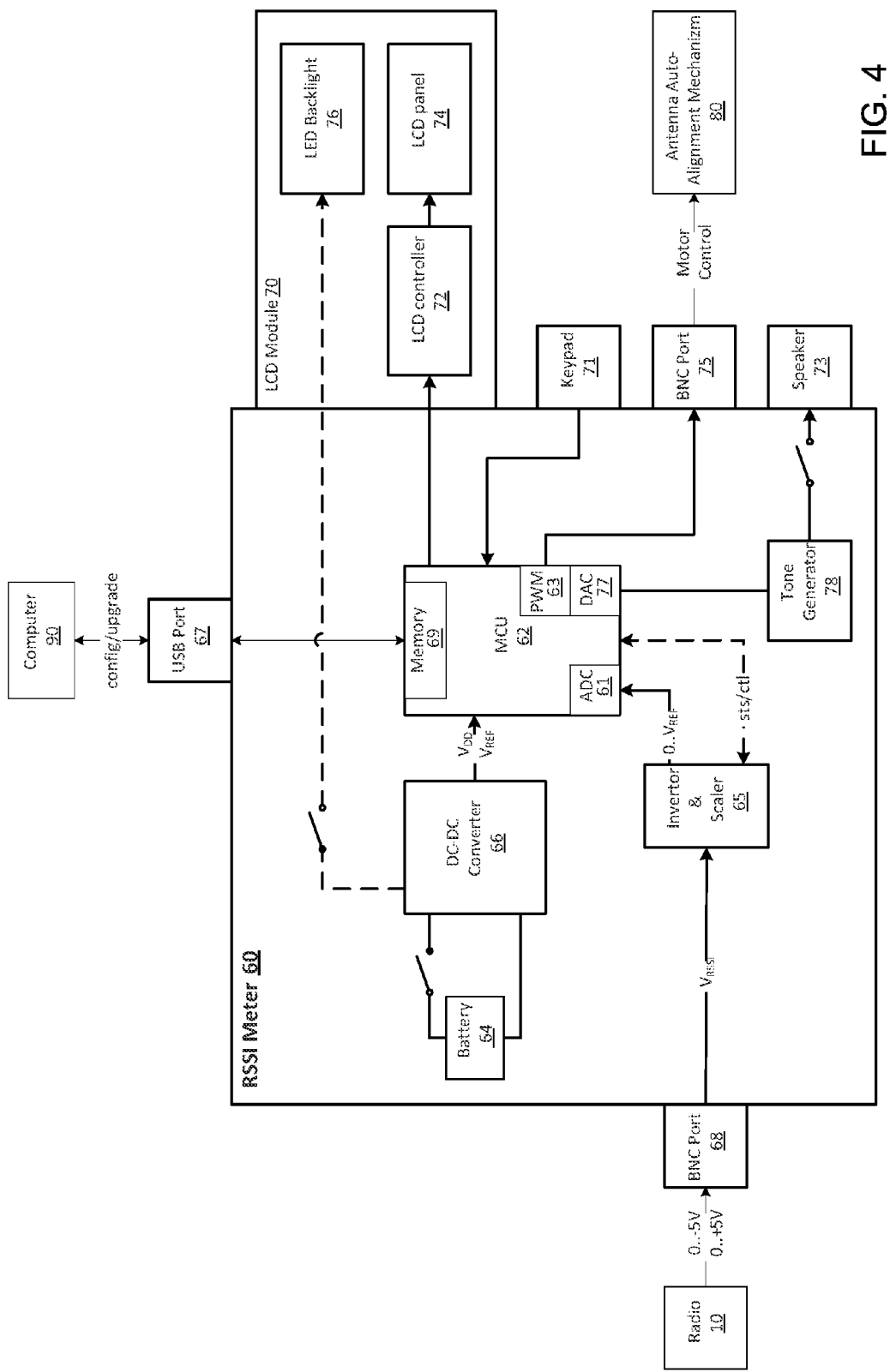
FIG. 4 depicts different components within the RSSI meter and its interfaces with other components of the outdoor application according to some implementations.

FIG. 4 depicts different components within the RSSI meter 60 and its interfaces with other parts of the outdoor application according to some implementations. At the heart of the RSSI meter 60 is a microcontroller unit (MCU) 62, which is responsible for converting the voltage signal into a control signal or a receiver signal level that is more intuitive to a technician who is responsible for installing and calibrating the antenna 20 and the radio unit 10.

As shown in the figure, the voltage signal from the radio unit 10 is an analog signal in the range of (−5V, 5V). This radio signal enters the RSSI meter 60 through a Bayonet Neill-Concelman (BNC) port 68. In this implementation, the RSSI meter 60 includes an inverter and scaler module 65 for pre-processing the analog voltage signal before it arrives at the MCU 62 by, e.g., shifting and scaling the signal within a range between 0 and $V_{REF}$. In some implementations, the MCU 62 has a built-in analog-to-digital converter (ADC) 61 for processing (e.g., digitizing) the antenna receiver voltage signal into a digital value. In some other implementations, the ADC 61 is a standalone component between the BNC port 68 and the MCU 62.

The MCU 62 is a digital processor that includes memory 69 (e.g., ROM, RAM or flash memory) for storing modules used for processing the digitized voltage signal coming from the radio 10. In some implementations, the RSSI meter 60 includes a USB port 67, through which the MCU 62 is coupled to a computer 90 (e.g., a desktop/laptop/tablet). As noted above, different antenna/ODU vendors have their own RSSI versus RSL curves. In order to support different vendors, a technician may configure the RSSI meter 60 by preloading the corresponding processing modules developed for different vendors into the memory 69 and upgrade them subsequently, e.g., replacing the current version with a new version. This configuration/upgrade process may happen at a remote site away from the radio installation site or at the radio installation site. The USB port 67 provides a convenient interface for achieving this goal.

FIG. 4 further depicts that the RSSI meter 60 includes a LCD module 70 for displaying the receiver signal level determined by the MCU 62. The LCD module 70 includes a LCD controller 72, a LCD panel 74 coupled to the LCD controller 72, and a LED module 76 for providing backlight to the LCD panel 74. In some implementations, this LCD module 70 can display information about different processing modules stored in the memory 69 to a technician so that the technician can choose the correct processing module when calibrating the antenna's position and orientation through an input device, e.g., the keypad 71. In some implementations, the keypad 71 includes other buttons such as an on/off switch for controlling the RSSI meter 60.

In some implementations, the MCU 62 includes a pulse-width modulator (PWM) 63 for converting the receiver signal level (which is a digital value) back to an antenna tuning signal (which is an analog signal) for other purposes. For example, the RSSI meter 60 outputs the antenna tuning signal through another BNC port 75 as a motor control signal to the antenna auto-aligning mechanism 80. The antenna auto-aligning mechanism 80 then operates certain parts of the antenna mount 40 to adjust the position and orientation of the antenna 20 accordingly. In another example, the MCU 62 includes a digital-to-analog converter (DAC) 77 for converting the receiver signal level back to an analog signal and the tone generator 78 converts the analog signal into an audio signal and broadcasts the audio signal through a speaker 73. In this case, the frequency of the audio signal substantially corresponds to the receiver signal level so that a technician can tell from the audio signal on how to adjust the antenna auto-aligning mechanism 80.

In some implementations, the RSSI meter 60 is a portable device that has its power system including the battery set 64 and the DC-DC converter 66, which provides different levels of power to different components of the RSSI meter 60.

Figures 5A, 5B, 5C:
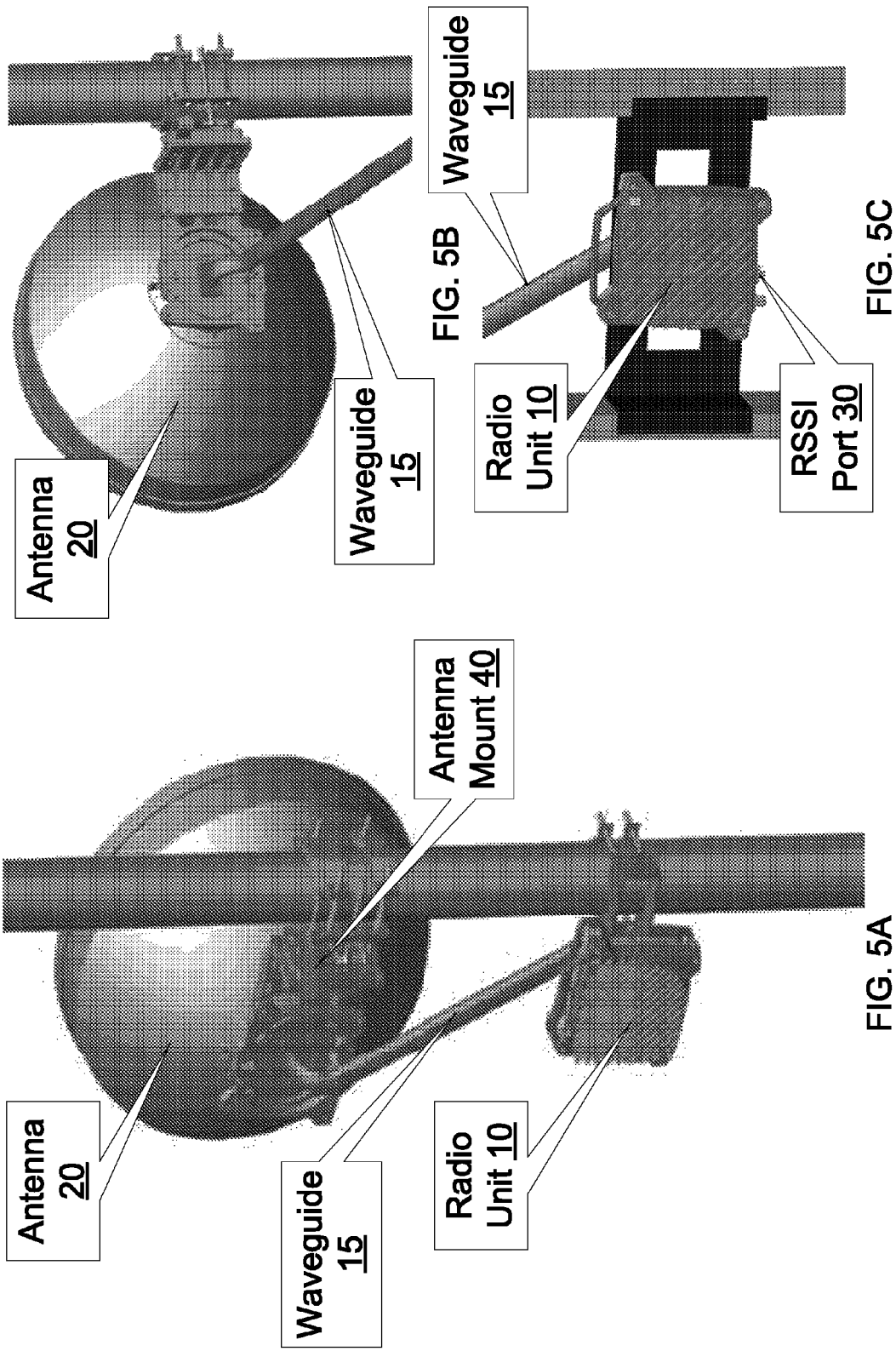
FIGS. 5A through 5C depict, respectively, remotely-located and indoor communication application including an antenna and a radio unit that has an RSSI port according to some implementations.

FIGS. 5A through 5C depict, respectively, remotely-located and indoor communication application including an antenna 20 and a radio unit 10 that has an RSSI port 30 according to some implementations. As shown in FIG. 5A, the antenna 20 is attached to a pole through an antenna mount 40. There is a waveguide 15 connecting the radio unit 10 and the antenna 20 together so that a wireless signal from another radio and antenna system in the line of sight can be detected by the antenna 20 and then transmitted through the radio unit 10 to a destination in the communication network and vice versa. As described above in connection with FIG. 1, the RSSI port 30 exports a voltage signal indicative of a receiver input level at the antenna 20. A radio installation technician uses this voltage signal as a reference to check whether the position and orientation (e.g., horizontal positions and antenna azimuth) of the antenna is optimized for transmitting/receiving wireless signals.

Figure 6A:
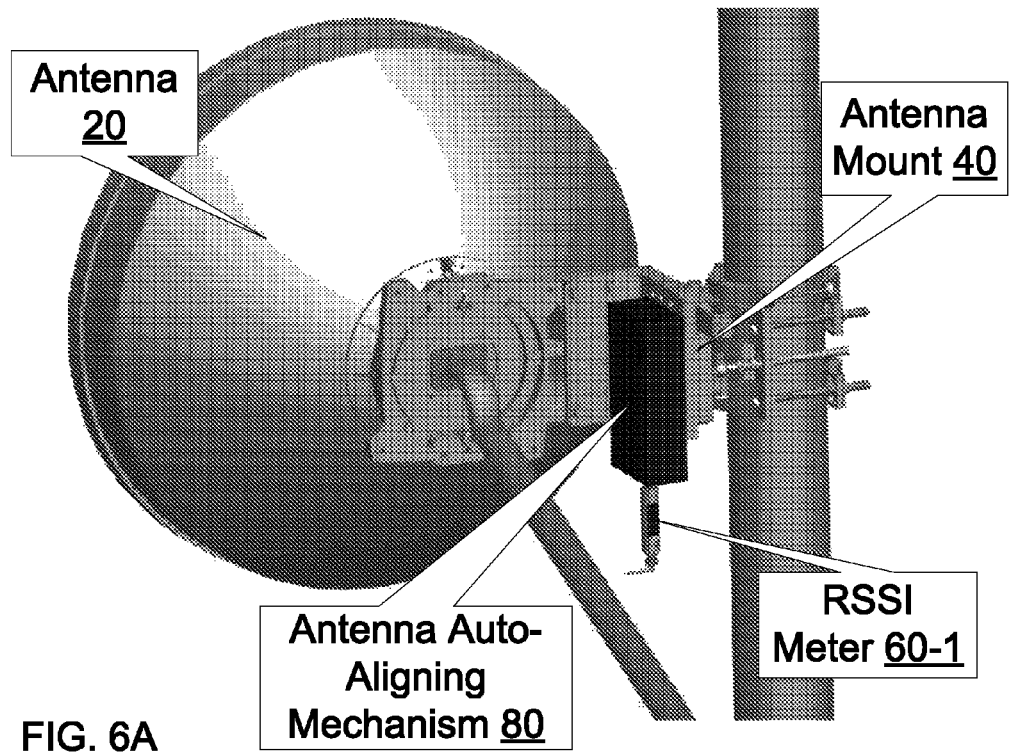
FIGS. 6A and 6B depict, respectively, an indoor communication application including an antenna, a radio unit that has an RSSI port, an antenna auto-alignment mechanism, and a distributed antenna receiver signal strength indicator system according to some implementations.
Figure 6B:
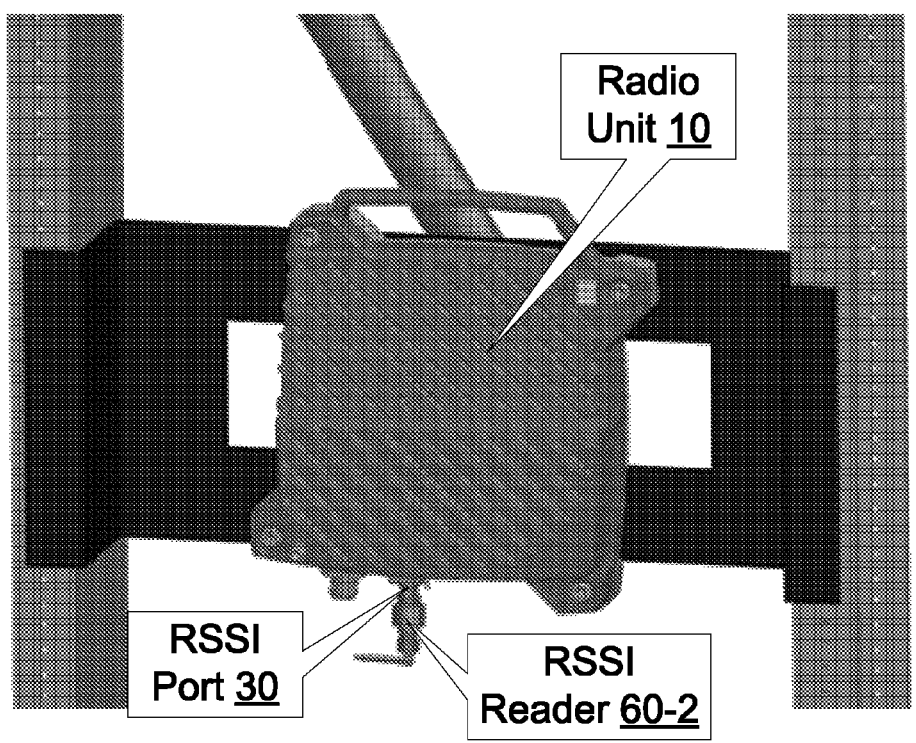

FIGS. 6A and 6B depict, respectively, an indoor communication application including an antenna 20, a radio unit 10 that has an RSSI port 30, and an antenna auto-alignment mechanism 80. Unlike the implementation described above in connection with FIG. 3, the indoor communication application includes a distributed antenna receiver signal strength indicator system 60 that is comprised of an RSSI reader 60-2 and an RSSI meter 60-1, both of which have the capability to communicate each other wirelessly, according to some implementations. In this example, the RSSI reader 60-2 is attached to the radio unit 10 through the RSSI port 30 and the RSSI meter 60-1 is attached to the auto-alignment mechanism 80. The radio unit 10 feeds a voltage signal into the RSSI reader 60-2, the voltage signal dependent on the position and orientation of the antenna 20. The RSSI reader 60-2 then wirelessly transmits the signal to the RSSI meter 60-1.

Upon receipt of the wireless signal, the RSSI meter 60-1 automatically converts the signal into an antenna tuning signal and feeds the antenna tuning signal into the antenna auto-alignment mechanism 80. In response, the antenna auto-alignment mechanism 80 causes some parts of the antenna mount 40 to move by an amount defined by the antenna tuning signal. As a result, the antenna 20 has a new position and orientation and generates an updated output at the RSSI port 30. In other words, the RSSI port 30, the RSSI reader 60-2, and the RSSI meter 60-1 work in concert to provide a feedback signal to the antenna auto-alignment mechanism 80 for adjusting the position and orientation of the antenna and improving the performance of the antenna 20. As will be described in detail below in connection with FIG. 7, this method can effectively free the technician from the tedious work required by the conventional approach and it is also helpful to improve the performance of the entire communication network.

Figure 7:
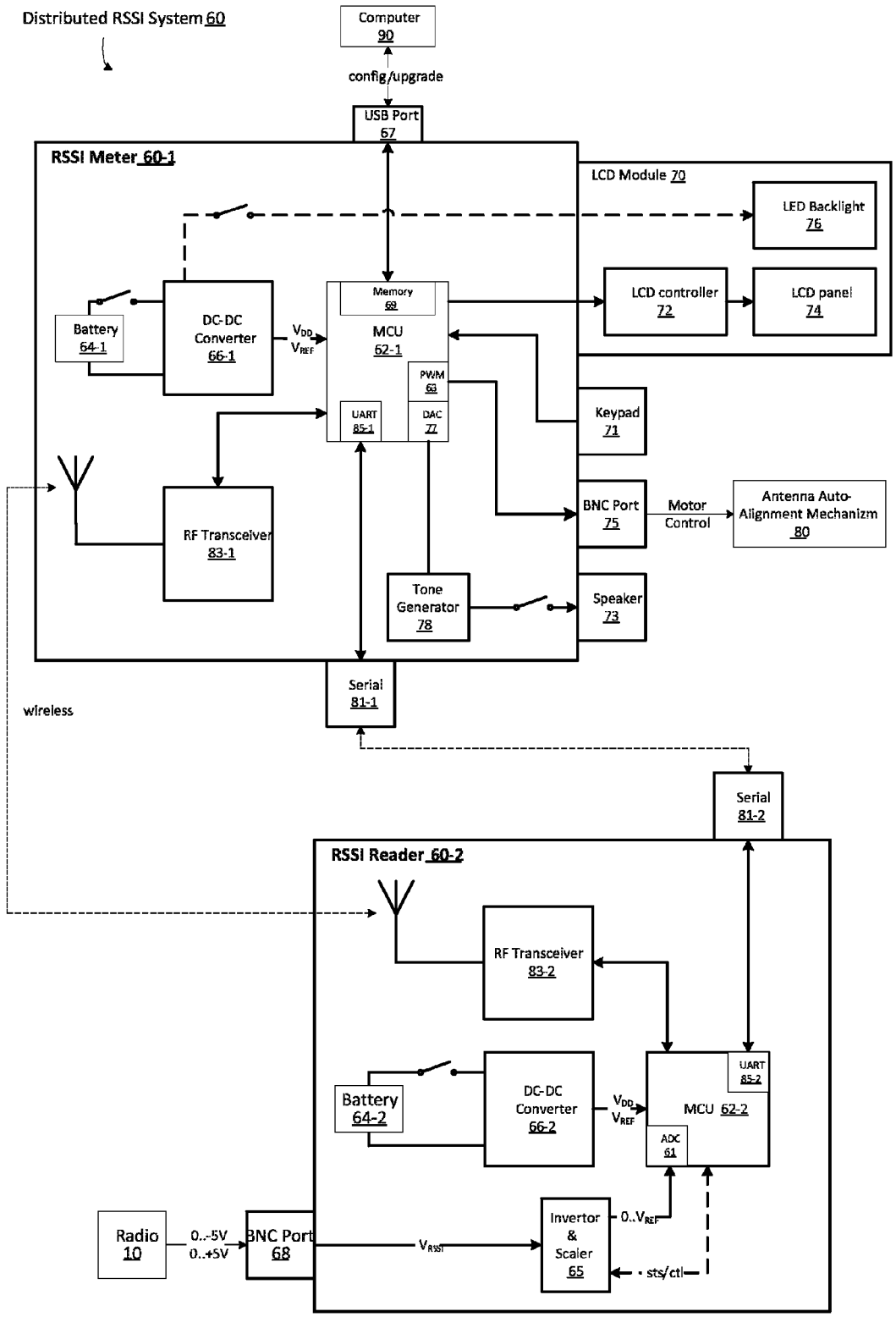
FIG. 7 depicts different components within the distributed RSSI system and its internal/external interfaces with other equipment of the indoor application according to some implementations.

FIG. 7 depicts different components within the distributed RSSI system 60 and its internal/external interfaces with other parts of the indoor application according to some implementations. As shown in FIG. 7, the distributed RSSI system 60 includes two major components: RSSI reader 60-2 and RSSI meter 60-1. Within the RSSI reader 60-2 is a microcontroller unit (MCU) 62-2 and a RF transceiver 83-2. The MCU 62-2 is responsible for receiving the RSSI voltage signal from the radio 10, converting the voltage signal into a digital signal, and pre-processing the digitized voltage signal if necessary. The RF transceiver 83-2 is responsible for transmitting the voltage signal to the RSSI meter 60-1. The RSSI meter 60-1 also includes a MCU 62-1 and a RF transceiver 83-1. The RF transceiver 83-1 receives the wireless signal from the RE transceiver 83-2 and then feeds the signal into the MCU 62-1. The MCU 62-1 is responsible for generating a control signal or a receiver signal level based on the RSSI voltage signal from the radio 10, which is typically more intuitive to a technician who is responsible for installing the antenna 20 and the radio unit 10 than the RSSI voltage signal itself.

As shown in FIG. 7, the voltage signal from the radio unit 10 is an analog signal in the range of (−5V, 5V). This radio signal enters the RSSI reader 60-2 through a BNC port 68. In this implementation, the RSSI reader 60-2 includes an inverter and scaler module 65 for processing the analog voltage signal before it arrives at the MCU 62-2 by, e.g., shifting and scaling the voltage signal within a range between 0 and $V_{REF}$. In some implementations, the MCU 62-2 has a built-in analog-to-digital converter (ADC) 61 for digitizing the antenna receiver voltage signal into a digital value. In some other implementations, the ADC 61 is a standalone component between the BNC port 68 and the MCU 62-2.

As described above, there is a wireless communication channel between the pair of RF transceivers 83-2 and 83-1. In some implementations, there is also a wired communication channel between the RSSI reader 60-2 and the RSSI meter 60-1, e.g., through a cable between the universal asynchronous receiver/transmitter (UART) 85-2 at the MCU 62-2 and the serial port 81-2 at the RSSI reader 60-2 and the corresponding serial port 81-1 and UART 85-1 at the RSSI meter 60-1. Note that the digitized voltage signal can be transmitted from the RSSI reader 60-2 to the RSSI meter 60-1 through either channel. In some implementations, the two channels do not exist at the same time. For example, if the wired channel is on, the wireless channel is turned off and vice versa.

The MCU 62-1 is a digital processor that includes memory 69 (e.g., ROM, RAM or flash memory) for storing modules used for processing the digitized voltage signal coming from the radio 10. In some cases, the RSSI meter 60-1 includes a USB port 67 through which the MCU 62-1 is coupled to a computer 90 (e.g., a desktop/laptop/tablet). As noted above, because different antenna/radio unit vendors have their own RSSI versus RSL curves, a technician may configure the RSSI meter 60-1 by preloading the corresponding processing modules developed for different vendors into the memory 69 and upgrade them subsequently, e.g., replacing the current version with a new version. This configuration/upgrade process may happen at a remote site away from the radio installation site or at the radio installation site. The USB port 67 provides a convenient interface for achieving this goal.

FIG. 7 also depicts that the RSSI meter 60-1 includes a LCD module 70 for displaying the receiver signal level determined by the MCU 62-1. The LCD module 70 further includes a LCD controller 72, a LCD panel 74 coupled to the LCD controller 72, and a LED module 76 for providing backlight to the LCD panel 74. In some implementations, this LCD module 70 can display information about different processing modules stored in the memory 69 to a technician so that the technician can choose the correct processing module when calibrating the antenna's position and orientation through an input device, e.g., the keypad 71. In some implementations, the keypad 71 includes other buttons such as an on/off switch for controlling the RSSI meter 60.

In some implementations, the MCU 62-1 includes a pulse-width modulator (PWM) 63 for converting the receiver signal level (which is a digital value) back to an antenna tuning signal (which is an analog signal) for other purposes. For example, the RSSI meter 60-1 outputs the antenna tuning signal through another BNC port 75 as a motor control signal to the antenna auto-alignment mechanism 80. The antenna auto-alignment mechanism 80 then operates certain parts of the antenna mount 40 to adjust the position and orientation of the antenna 20 accordingly. In another example, the MCU 62-1 includes a digital-to-analog converter (DAC) 77 for converting the receiver signal level back to an analog signal and the tone generator 78 converts the analog signal into an audio signal and broadcast the audio signal through a speaker 73. In this case, the frequency of the audio signal substantially corresponds to the receiver signal level so that a technician can tell from the audio signal on how to adjust the antenna auto-aligning mechanism 80.

In some implementations, the RSSI reader 60-2 and the RSSI meter 60-1 are both portable devices that have their power system including the battery set (64-2, 64-1) and the DC-DC converter (66-2, 66-1), which provides different levels of power to different components within the RSSI reader 60-2 and the RSSI meter 60-1, respectively.

While particular implementations are described above, it will be understood it is not intended to limit the invention to these particular implementations. On the contrary, the invention includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the implementations.

Although the terms first, second, etc. may be used herein to describe various elements, these elements should not be limited by these terms. These terms are only used to distinguish one element from another. For example, first ranking criteria could be termed second ranking criteria, and, similarly, second ranking criteria could be termed first ranking criteria, without departing from the scope of the present invention. First ranking criteria and second ranking criteria are both ranking criteria, but they are not the same ranking criteria.

The terminology used in the description of the invention herein is for the purpose of describing particular implementations only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Although some of the various drawings illustrate a number of logical stages in a particular order, stages that are not order dependent may be reordered and other stages may be combined or broken out. While some reordering or other groupings are specifically mentioned, others will be obvious to those of ordinary skill in the art and so do not present an exhaustive list of alternatives. Moreover, it should be recognized that the stages could be implemented in hardware, firmware, software or any combination thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain principles of the invention and its practical applications, to thereby enable others skilled in the art to best utilize the invention and various implementations with various modifications as are suited to the particular use contemplated. Implementations include alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the implementations.

What is claimed:

1. An antenna receiver signal strength indicator meter, comprising:
    a microcontroller unit including an analog-to-digital converter for digitizing an antenna receiver voltage signal, a module for converting the digitized antenna receiver voltage signal into a receiver signal level in accordance with a predefined antenna specification, and a pulse-width modulator for converting the receiver signal level into the antenna tuning signal in accordance with the predefined antenna specification;
    an input communication port that is coupled to the microcontroller unit, wherein the input communication port is configured to receive the antenna receiver voltage signal from an antenna and provide the antenna receiver voltage signal to the microcontroller unit through the analog-to-digital converter; and
    an output communication port that is coupled to the microcontroller unit, wherein the output communication port is configured to receive the antenna tuning signal from the microcontroller unit through the pulse-width modulator and provide the antenna tuning signal to an antenna auto-aligning mechanism for adjusting position and orientation of the antenna.

2. The antenna receiver signal strength indicator meter of claim 1, wherein the antenna receiver voltage signal is, at least in part, dependent upon the position and orientation of the antenna.

3. The antenna receiver signal strength indicator meter of claim 1, further comprising a speaker module for broadcasting a sound signal whose frequency substantially corresponds to the receiver signal level.

4. The antenna receiver signal strength indicator meter of claim 1, further comprising a keypad module for a user to enter operation instructions to the microcontroller unit, wherein the operation instructions are used for controlling the antenna auto-aligning mechanism for adjusting the position and orientation of the antenna.

5. The antenna receiver signal strength indicator meter of claim 1, further comprising an inverter and scaler module that is coupled between the input communication port and the analog-to-digital converter for processing the antenna receiver voltage signal before it reaches the analog-to-digital converter in the microcontroller unit.

6. The antenna receiver signal strength indicator meter of claim 1, wherein both the input and output communication ports are BNC ports.

7. The antenna receiver signal strength indicator meter of claim 1, further comprising a LCD module for displaying the receiver signal level.

8. The antenna receiver signal strength indicator meter of claim 7, wherein the LCD module further comprises: a LCD controller, a LCD panel coupled to the LCD controller, and a LED module for providing backlight to the LCD panel.

9. A distributed antenna receiver signal strength indicator system, comprising:
    an antenna receiver signal strength indicator reader for receiving an antenna receiver voltage signal from an antenna and digitizing the antenna receiver voltage signal; and
    an antenna receiver signal strength indicator meter for receiving the digitized antenna receiver voltage signal from the antenna receiver signal strength indicator reader and converting the antenna receiver voltage signal into an antenna tuning signal in accordance with a predefined antenna specification, wherein the antenna tuning signal is provided to an antenna auto-alignment mechanism for adjusting position and orientation of the antenna; and wherein there is a wireless connection between the antenna receiver signal strength indicator reader and the antenna receiver signal strength indicator meter and the digitized antenna receiver voltage signal is transmitted to the antenna receiver signal strength indicator meter via the wireless connection.

10. The distributed antenna receiver signal strength indicator system of claim 9, wherein the antenna receiver signal strength indicator reader further includes a microcontroller unit including an analog-to-digital converter for digitizing the antenna receiver voltage signal.

11. The distributed antenna receiver signal strength indicator system of claim 10, wherein the antenna receiver signal strength indicator reader further includes an input communication port that is coupled to the microcontroller unit, wherein the input communication port is configured to receive the antenna receiver voltage signal from the antenna and provide the antenna receiver voltage signal to the microcontroller through the analog-to-digital converter.

12. The distributed antenna receiver signal strength indicator system of claim 9, wherein the antenna receiver signal strength indicator meter further includes a microcontroller unit including a module for converting the digitized antenna receiver voltage signal into a receiver signal level in accordance with the predefined antenna specification.

13. The distributed antenna receiver signal strength indicator system of claim 12, wherein the microcontroller unit further includes a pulse-width modulator for converting the receiver signal level into the antenna tuning signal.

14. The distributed antenna receiver signal strength indicator system of claim 13, wherein the antenna receiver signal strength indicator meter further includes an output communication port that is coupled to the microcontroller unit, and the output communication port is configured to receive the antenna tuning signal from the microcontroller unit through the pulse-width modulator and provide the antenna tuning signal to the antenna auto-alignment mechanism for adjusting the position and orientation of the antenna.

15. The distributed antenna receiver signal strength indicator system of claim 9, wherein the antenna receiver signal strength indicator reader includes a radio-frequency transceiver module for transmitting the digitized antenna receiver voltage signal to the antenna receiver signal strength indicator meter and the antenna receiver signal strength indicator meter includes a radio-frequency transceiver module for receiving the digitized antenna receiver voltage signal from the antenna receiver signal strength indicator reader.

16. The distributed antenna receiver signal strength indicator system of claim 15, wherein the wireless connection is implemented in accordance with a wireless protocol selected from the group consisting of Wi-Fi, Bluetooth, and RFID.

17. The distributed antenna receiver signal strength indicator system of claim 9, wherein there is a wired connection between the antenna receiver signal strength indicator reader and the antenna receiver signal strength indicator meter and the digitized antenna receiver voltage signal is transmitted to the antenna receiver signal strength indicator meter via the wired connection.

18. The distributed antenna receiver signal strength indicator system of claim 17, wherein the wired connection is implemented through a cable connecting a pair of serial ports located at the antenna receiver signal strength indicator reader and the antenna receiver signal strength indicator meter, respectively.

* * * * *